(12) United States Patent
Liang

(10) Patent No.: US 12,381,483 B2
(45) Date of Patent: Aug. 5, 2025

(54) LOAD DISCONNECT BOOST CONVERTER

(71) Applicant: Texas Instruments Incorporated, Dallas, TX (US)

(72) Inventor: Jian Liang, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 133 days.

(21) Appl. No.: 18/149,213

(22) Filed: Jan. 3, 2023

(65) Prior Publication Data

US 2024/0223081 A1    Jul. 4, 2024

(51) Int. Cl.
*H02M 3/156* (2006.01)
*H02M 1/08* (2006.01)
*H03K 3/017* (2006.01)
*H03K 5/24* (2006.01)

(52) U.S. Cl.
CPC .............. *H02M 3/156* (2013.01); *H02M 1/08* (2013.01); *H03K 3/017* (2013.01); *H03K 5/24* (2013.01)

(58) Field of Classification Search
CPC .......... H02M 3/156; H02M 1/08; H02M 1/36; H02M 3/158; H03K 3/017; H03K 5/24
See application file for complete search history.

(56) References Cited

U.S. PATENT DOCUMENTS

| | | | |
|---|---|---|---|
| 8,872,491 B2 * | 10/2014 | Takano | H02M 1/36 323/276 |
| 10,044,263 B2 * | 8/2018 | Kumar | H02M 3/156 |
| 11,881,770 B2 | 1/2024 | Liang | |
| 11,996,847 B1 * | 5/2024 | Kazama | H02M 3/155 |
| 2003/0085693 A1 | 5/2003 | Marty | |
| 2011/0009171 A1 * | 1/2011 | Watanabe | G05F 1/56 323/273 |
| 2012/0062198 A1 | 3/2012 | Takano | |

(Continued)

FOREIGN PATENT DOCUMENTS

CN    204697031 U    10/2015

OTHER PUBLICATIONS

International Search Report mailed Apr. 24, 2024.

(Continued)

*Primary Examiner* — Kyle J Moody
(74) *Attorney, Agent, or Firm* — Valerie M. Davis; Frank D. Cimino

(57) ABSTRACT

Load disconnect techniques for boost converters. In an example, a power converter includes a driver circuit, a control circuit, and a comparator circuit. During normal boost operation (VIN<VOUT), the comparator circuit disables the control circuit and enables the driver circuit, which in turn fully turns on a high-side switching element during high-side on-phase. In contrast, during start-up operation or an output short-to-ground condition (VIN≥VOUT), the comparator circuit disables the driver circuit and enables the control circuit, which in turn controls the gate voltage of the high-side switching element, so the current through the switching element is regulated, and the switching node voltage is regulated to about a threshold voltage higher than VIN. In this manner, the comparator circuit controls the driver circuit and the control circuit, which in turn allow the boost converter to operate in a normal fashion even when VIN is higher than VOUT.

21 Claims, 8 Drawing Sheets

(56) References Cited

U.S. PATENT DOCUMENTS

2019/0265739 A1 8/2019 Kuroda
2024/0146177 A1* 5/2024 Mehdi .................... H02M 3/07

OTHER PUBLICATIONS

"MP3421 5.5A, 600kHz High-Efficiency, Synchronous Step-Up Converter with True Output Disconnect in a 2mm×2mm QFN Package," MPS (Monolithic Power), Nov. 13, 2014, pp. 1-16.
"TPS61021A 3-A Boost Converter with 0.5-V Ultra Low Input Voltage," Texas Instruments, SLVSDM0, Jun. 2016, pp. 1-34.
"TPS61023 3.7-A Boost Converter with 0.5-V Ultra-low Input Voltage," Texas Instruments, SLVSF14B, Sep. 2019—revised Aug. 2020, pp. 1-28.
"TPS6123x 8-A Valley Current Synchronous Boost Converters with Constant Current Output Feature," Texas Instruments, SLVSCK4A, Sep. 2015—revised May 2016, pp. 1-38.

* cited by examiner

LOAD DISCONNECT BOOST CONVERTER

TECHNICAL FIELD

This description relates to regulated power supplies, and more particularly, to a load disconnect boost converter.

BACKGROUND

The direct current (DC) output voltage provided by a standard power supply to a load can vary due to any number of factors such as transient conditions, environmental conditions, and changing load conditions. In such cases, a voltage regulator can be coupled between the power supply and the load and used to provide a regulated DC output voltage to the load. In this manner, the output voltage of the voltage regulator remains unaffected by abrupt or otherwise transient changes in the input supply voltage and the load current. There are many types of DC-to-DC voltage regulators, including switching regulators and linear regulators. One feature a boost converter may include is load disconnect. One method to accomplish the load disconnect function is using a high-side p-channel metal oxide semiconductor field effective transistor (PMOS FET) to disconnect the boost converter's input voltage from the output, when the converter is disabled. A number of non-trivial issues remain with such load disconnect boost converters.

SUMMARY

One example includes a power supply circuit that includes first and second transistors and a comparator circuit. The comparator circuit has a comparator output and first and second comparator inputs. The first comparator input is coupled to an input voltage terminal, and the second comparator input is coupled to an output voltage terminal. The comparator circuit is configured to provide a voltage at the comparator output, in which the provided voltage is a larger of a voltage at the first comparator input or a voltage at the second comparator input. The first transistor is coupled between the output voltage terminal and the input voltage terminal. The second transistor is coupled between a control terminal of the first transistor and the input voltage terminal, the second transistor having a control terminal coupled to the comparator output.

Another example is a power supply circuit that includes first and second transistors, high-side and low-side switching transistors, a high-side driver circuit, a pulse width modulation (PWM) controller, and a comparator circuit. The comparator circuit has first and second comparator inputs and first and second comparator outputs. The first comparator input is coupled to an input voltage terminal, and the second comparator input is coupled to an output voltage terminal. The comparator circuit is configured to provide a voltage at the first comparator output, in which the provided voltage is a larger of a voltage at the first comparator input or a voltage at the second comparator input. The comparator circuit is further configured to provide at the second comparator output a logic low signal responsive to the voltage at the first comparator input being less than the voltage at the second comparator input, and to provide at the second comparator output a logic high signal responsive to the voltage at the first comparator input being greater than or equal to the voltage at the second comparator input. The high-side switching transistor has a drain terminal coupled to the output voltage terminal, and a source terminal coupled to the input voltage terminal. The first transistor has a drain terminal coupled to a gate terminal of the high-side switching transistor via a diode, a source terminal coupled to the input voltage terminal, and a gate terminal coupled to the first comparator output. The diode has its anode coupled to the drain terminal of the first transistor and its cathode coupled to the gate terminal of the high-side switching transistor. The second transistor has a drain terminal coupled to the gate terminal of the high-side switching transistor via a resistor, a source terminal coupled to a ground terminal, and a gate terminal coupled to the second comparator output. The high-side driver circuit has a high-side driver circuit input, a high-side driver circuit output, and a high-side driver circuit enable input. The high-side driver circuit output is coupled to the cathode of the diode and the gate terminal of the high-side switching transistor, and the high-side driver circuit enable input is coupled to the second comparator output. The low-side transistor has a drain terminal coupled to the input voltage terminal and a source terminal coupled to the ground terminal. The PWM controller has a high-side output and a low-side output. The high-side output of the PWM controller is coupled to the high-side driver circuit input, and the low-side output of the PWM controller is coupled to a gate terminal of the low-side transistor. In some such cases, the high-side switching transistor is an n-channel power field effect transistor (FET), and has its body terminal coupled to its drain terminal via a resistor.

Another example is a comparator circuit. The comparator circuit includes a first input terminal to receive an input voltage of a power supply circuit, and a second input terminal to receive an output voltage of the power supply circuit. The comparator circuit further includes a first output terminal to provide the larger of the input voltage or the output voltage, and a second output terminal to provide a logic low signal responsive to the input voltage being less than the output voltage, and to provide a logic high signal responsive to the input voltage being greater than or equal to the output voltage. In one such example, the comparator circuit includes first and second switches, an inverter, and an amplifier. The amplifier has its non-inverting input coupled to the first input terminal, its inverting input coupled to the second input terminal, and its amplifier output coupled to the second output terminal. The first switch is for switching the input voltage to the first output terminal, and has a first switch control terminal coupled to the amplifier output. The second switch is for switching the output voltage to the first output terminal, and has a second switch control terminal. The inverter has its inverter input coupled to the amplifier output, and it inverter output coupled to the second switch control terminal. In some cases, the comparator circuit is includes in a power supply circuit, wherein the first input terminal is coupled to an input voltage terminal of the power supply circuit, and the second input terminal is coupled to an output voltage terminal of the power supply circuit.

DETAILED DESCRIPTION

Figure 1:
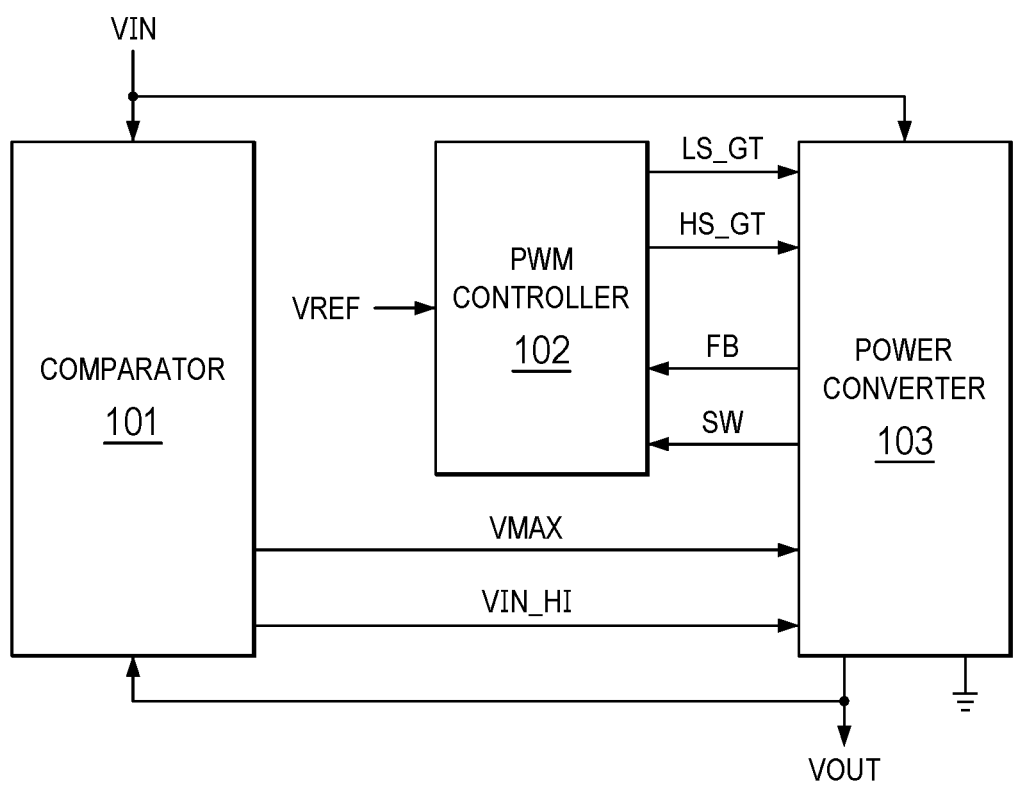
FIG. 1 illustrates a block diagram of a switching power supply, in an example.

Load disconnect techniques for boost converters are described herein. The techniques can be used in any number of boost configurations, but are particularly well-suited for a boost converter configuration having an NMOS FET for a high-side switching element. The boost converter can achieve a load disconnect function, and can survive a short-to-ground at the output terminal. In one such example, a boost power supply includes a driver circuit, a control circuit, and a comparator circuit. During normal boost operation (VIN<VOUT), the comparator circuit disables the control circuit and enables the driver circuit, which in turn fully turns-on a high-side NMOS FET during high-side on-phase. During start-up operation or a short-to-ground condition at the output terminal (VIN≥VOUT), the comparator circuit disables the driver circuit and enables the control circuit, which in turn controls the gate voltage of the high-side NMOS FET, so the current through the NMOS FET is regulated. For example, during a start-up or short-circuit condition, the switching node voltage is regulated to about a threshold voltage (e.g., VTH or VGS of about 1 volt) higher than VIN, and the NMOS FET operates in saturation mode and the boost inductor current follows the volt-second balance rule, and the boost converter can operate similar to normal.

General Overview

Without load disconnect in a boost converter, there may be leakage current from input supply and through the rectifier diode to the output load even when the converter is in a disabled state (e.g., I=(VIN−VBE)/RLOAD, where I is the leakage current, VIN is the input supply voltage, VBE is the voltage drop across a rectifier diode coupled between VIN and VOUT, and RLOAD is the load resistance). Also, without load disconnect, the converter may be unable to survive a short-to-ground at the output terminal, and there is no slope control at start-up when ramping VOUT from 0 volts to VIN. As described above, load disconnect in a boost converter is usually accomplished using a high-side PMOS FET to disconnect the converter's input voltage from the output voltage when the converter is disabled. In operation, the back-gate of the PMOS FET can switch to the switching node or the output terminal, so the output load is disconnected from the input voltage supply, when the converter is disabled. Also, during a short-circuit to ground condition at the output, the PMOS FET can clamp the switching node to a lower voltage, thus allowing the converter to survive the short-circuit condition. However, using a PMOS power FET for the high-side switching element has a high cost and limits the power density of the boost converter. For example, the specific on-resistance (Rsp, which equals RDSon*area) of a PMOS power FET is about 2× to 5× larger compared to an NMOS power FET. Because of these limitations associated with using a PMOS power FET for the high-side, some boost converters use NMOS as the high-side FET. Unfortunately, such NMOS-based boost converter configurations cannot achieve load disconnect or survive a short-to-ground at the output terminal.

Thus, a boost converter is described herein that can achieve a load disconnect function, and can survive a short-to-ground at the output terminal. The boost converter can be implemented with an NMOS power FET for the high-side switching element, thus facilitating a significant space savings (e.g., up to 50% high-side FET die area). A comparator circuit controls the high-side driver circuit and a regulation loop, which in turn allows the boost converter to operate in a normal fashion even when VIN is higher than VOUT.

Circuit Architecture

FIG. 1 illustrates a block diagram of a switching power supply, in an example. As shown, the power supply includes a comparator circuit 101, a pulse width modulation (PWM) controller 102, and a power converter circuit 103. The switching power supply receives a given input voltage (VIN) at its input voltage terminal, and provides a regulated output voltage (VOUT) at its output voltage terminal. The values or ranges of VIN and VOUT can vary from one embodiment to the next but in some examples are both in the range of 3.3 volts to 35 volts (e.g., such as example cases where VIN equals 5 volts or 12 volts, and VOUT equals 5 volts or 8 volts).

The comparator circuit 101 has first and second comparator inputs and first and second comparator outputs (VMAX and VIN_HI). The first comparator input is coupled to the VIN terminal, and the second comparator input is coupled to VOUT terminal. The comparator circuit 101 is configured to provide the larger of VIN or VOUT at the VMAX comparator output. The comparator circuit 101 is further configured to provide at the VIN_HI comparator output a logic low signal responsive to VIN being less than VOUT, and to provide at the VIN_HI comparator output a logic high signal responsive to VIN being greater than or equal to VOUT. Further details of comparator circuit 101 are described below.

The PWM controller 102 is coupled to the switching node (SW) of the power converter circuit 103 and receives as input a reference voltage VREF and a feedback voltage FB representative of the output voltage VOUT, and is configured to generate the high-side gate drive signal HS_GT and the low-side gate drive signal LS_GT, which are provided to the input of the high-side bootstrap driver circuit and the control terminal of the low-side switching element, respectively, of the power converter circuit 103. VREF may be provided, for example, by a bandgap voltage reference, and feedback voltage FB may be provided by, for example, a voltage divider serially-connected between the VOUT and ground terminals. The PWM controller 102 can be implemented with any suitable PWM control scheme and circuitry.

The power converter circuit 103 is configured with a boost converter topology (e.g., boost or buck-boost) and can both achieve a load disconnect function and survive a short-to-ground at the VOUT terminal. In an example, the converter circuit 103 is implemented with an NMOS power FET for the high-side switching element. The converter circuit 103 can be implemented with any suitable boost converter circuitry, except that it is further configured with a control circuit and a high-side driver circuit that are responsive to outputs (VMAX and VIN_HI) of comparator circuit 101. Further details of converter circuit 103 are described below.

Figure 2A:
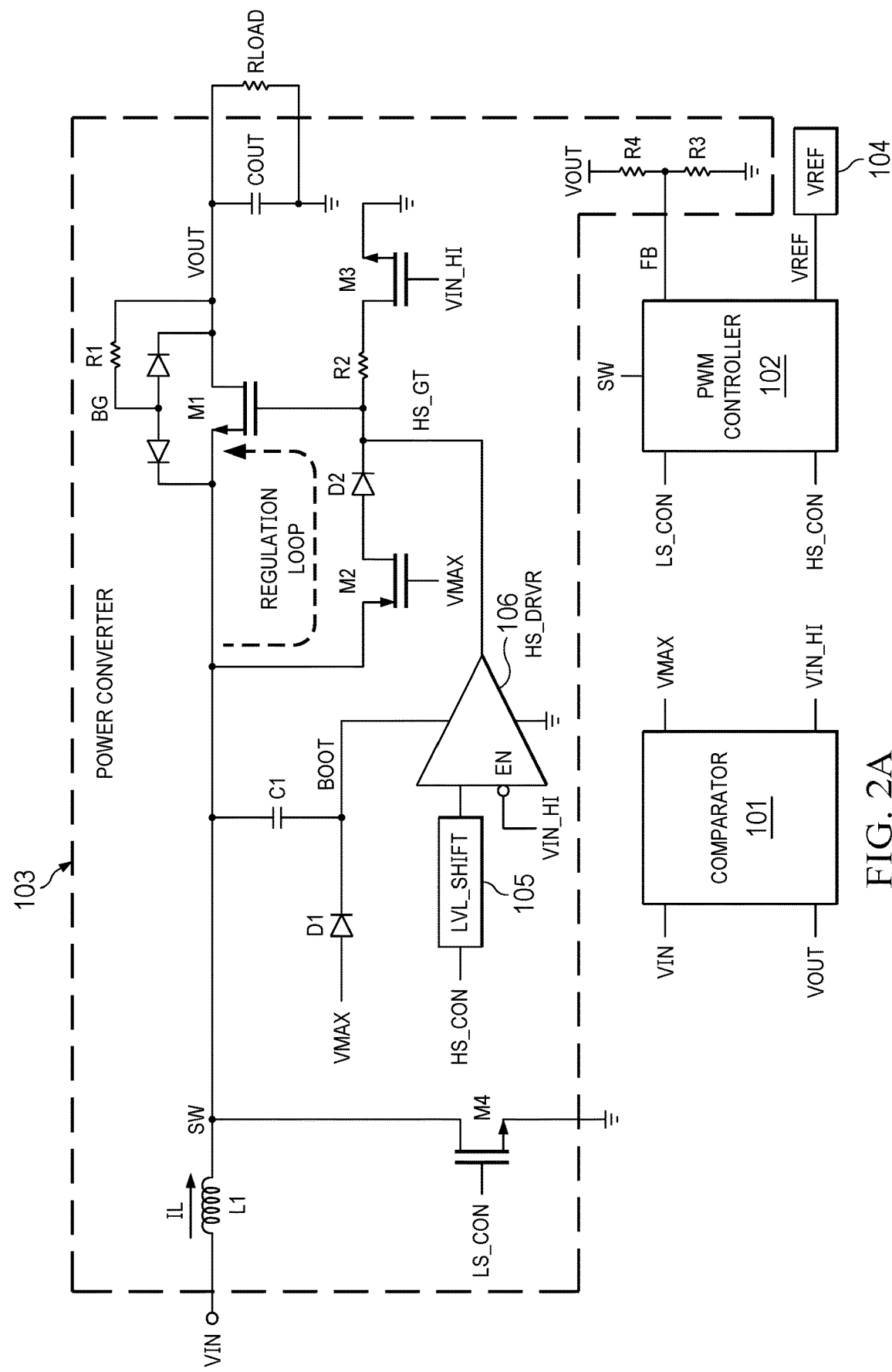
FIG. 2A illustrates a schematic diagram of a switching power supply, in an example.

FIG. 2A illustrates a schematic diagram of a switching power supply, in an example. As shown, the switching power supply is similar to that shown in FIG. 1, except that additional details of power converter circuit 103 are illustrated, according to one such example. The above relevant discussion with respect to comparator circuit 101 and PWM controller 102 is equally applicable here. In this example, the voltage reference VREF is provided to the PWM controller 102 by a VREF circuit 104, which may be, for example, a bandgap voltage reference circuit (e.g., such as a Brokaw or Widlar bandgap voltage reference). As further shown, the feedback voltage FB provided to the PWM controller 102 is generated by a voltage divider including resistors R3 and R4 serially-connected between the VOUT and ground terminals.

The power converter 103 is configured with a boost topology and includes inductor L1 coupled between the VIN terminal and the switching node (SW). A high-side switching element M1 is coupled between the switching node and the VOUT terminal, and a low-side switching element M4 is coupled between the switching node and ground terminal. An output capacitor COUT is coupled between the VOUT and ground terminals, as can be a load to be supplied with power (which is a resistive load, RLOAD, in this example). The control terminal of M1 is operatively coupled to a bootstrap driver circuit, as well as a control circuit that includes a regulation loop. The bootstrap driver circuit is further described below but in general receives at its input the high-side drive signal HS_GT generated by PWM controller 102 and applies a corresponding control signal to the control terminal of M1. The control terminal of M4 receives the low-side drive signal LS_GT generated by PWM controller 102. In this example, each of M1 and M4 is implemented with an NMOS power FET, wherein the M1 source is coupled to the VOUT terminal, the M1 drain is coupled to the switching node, the M1 gate is the M1 control terminal, the M4 source is coupled to the ground terminal, the M4 drain is coupled to the switching node, and the M4 gate is the M4 control terminal. Other examples may be configured differently and still provide comparable functionality.

The bootstrap diver circuit of this example includes a level shifter (LVL_SHIFT) 105 operatively coupled to a high-side gate driver (HS_DRVR) 106. Level shifter 105 receives at its input the high-side drive signal HS_GT generated by PWM controller 102 and provides a level-shifted version of that signal, which is applied to the input of high-side gate driver 106. The output of high-side gate driver 106 is coupled to the gate of M1. The positive supply rail of high-side gate driver 106 is coupled to the boot node, and the negative supply rail of driver 106 is coupled to virtual ground. The driver 106 is configured with an enable (EN) input that is coupled to the second comparator output VIN_HI. In this example, driver 106 is enabled responsive to VIN_HI being low, and disabled responsive to VIN_HI being high. Capacitor C1 is a bootstrap capacitor and coupled between the switching node and the boot node, and diode D1 has its anode coupled to the first comparator output VMAX and its cathode coupled to the boot node. With such a configuration, the first comparator output VMAX can charge capacitor C1 responsive to the switching node being low, and the charge of capacitor C1 will rise as the switching node voltage rises. Diode D1 blocks the path from the boot node to switching node responsive to the switching node being high and the boot node voltage being higher than VMAX. Other examples may be configured differently and still provide comparable functionality.

The control circuit that facilitates the regulation loop includes transistors M2 and M3, resistors R1 and R2, and diode D2. Transistor M2 is coupled between the switching node and the control terminal of transistor M1, and has its control terminal coupled to the first comparator output VMAX. Transistor M3 is coupled between the control terminal of transistor M1 and the ground terminal, and has its control terminal coupled to the second comparator output VIN_HI. In this example, transistor M2 is a PMOS FET and transistor M3 is an NMOS FET, wherein the M2 source is coupled to the switching node, the M2 drain is coupled to the M1 gate via diode D2, the M2 gate is coupled to the first comparator output VMAX, the M3 source is coupled to the ground terminal, the M3 drain is coupled to the M1 gate via resistor R2, and the M3 gate is the M3 control terminal. Diode D2 has its anode coupled to the M2 drain and its cathode coupled to the M1 gate, and resistor R2 is coupled between the M3 drain and the M1 gate. Responsive to VIN being less than VOUT (normal operation), the voltage at the M1 gate is higher than the voltage on the switching node, which reverse biases diode D2. In this manner, diode D2 blocks the output voltage of driver 106 from transistor M2 and the switching node. In this example, resistor R1 is used to bias the back-gate of M1, so the back-gate of M1 will not be floating. Resistor R2 controls the discharge speed (current) of the potential at the M1 gate, responsive to VIN_HI being high (when VIN≥VOUT, such as during the switching power supply start-up or a short-circuit condition on the VOUT terminal). Resistor R2 also provides a resistive load for the regulation loop. Other examples may be configured differently and still provide comparable functionality.

Figure 2B:
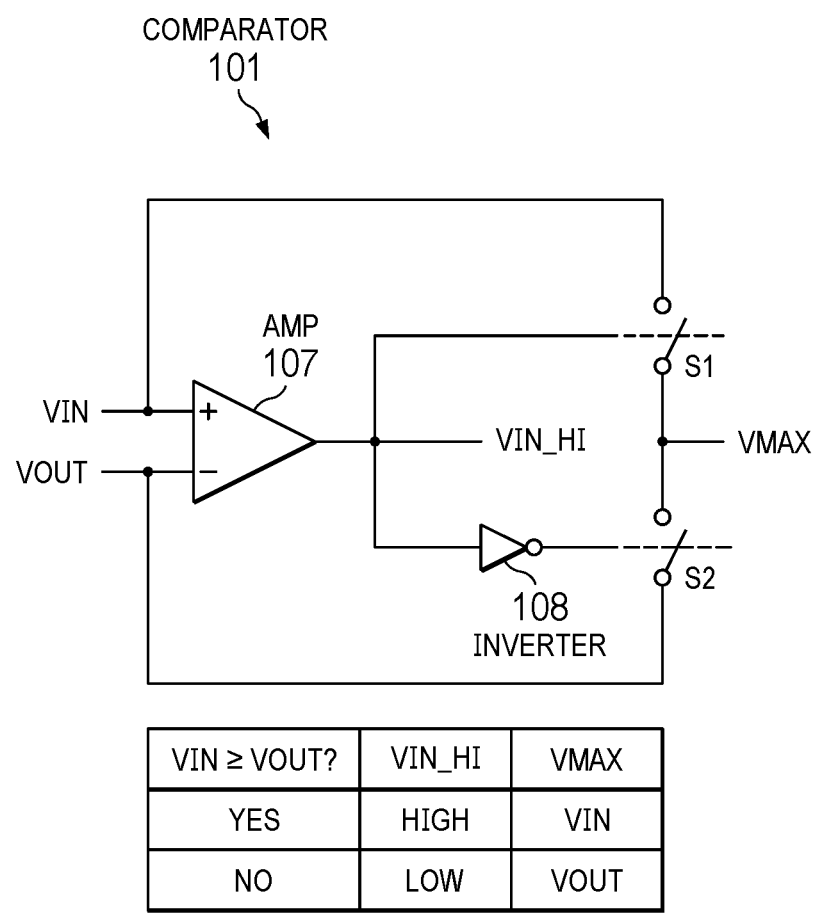
FIG. 2B illustrates a schematic diagram of a comparator circuit included in the switching power supply of FIG. 2A, in an example.

FIG. 2B illustrates a schematic diagram of comparator circuit 101, in an example. As shown, the circuit 101 includes an amplifier (AMP) 107 and an inverter 108 arranged to control the state of a first switch S1 and a second switch S2. The non-inverting input of amplifier 107 is coupled to the VIN terminal, and the inverting input of amplifier 107 is coupled to the VOUT terminal. Switch S1 is coupled between the VIN terminal and the VMAX output, and switch S2 is coupled between the VOUT terminal and the VMAX output. The output of amplifier 107 is coupled to the VIN_HI output. The output of amplifier 107 is also applied to the control terminal of switch S1, and to the input of inverter 108. The output of inverter 108 is applied to the control terminal of switch S2. The amplifier 107 is configured to determine the larger of VIN and VOUT. Such a configuration allows the comparator circuit 101 to determine whether the boost converter is operating in a normal mode (as characterized by VIN being less than VOUT) or a start-up or short-circuit condition (as characterized by VIN being greater than or equal to VOUT), and to configure the boost converter accordingly.

For example, if VIN is less than VOUT, then amplifier 107 generates a logic low signal and applies that logic low signal to the VIN_HI output. The logic low signal is applied to the enable input of driver 106 and the M3 gate, thus enabling driver 106 and disabling the regulation loop, for normal operation. The logic low signal is also applied to the control terminal of switch S1 which causes S1 to be in its open state, and to the input of inverter 108 which converts the low signal to a high signal that is in turn applied to the control terminal of switch S2 which causes S2 to be in its closed state. Thus, VOUT is provided on the VMAX output.

In contrast, if VIN is greater than or equal to VOUT, then amplifier 107 generates a logic high signal and applies that logic high signal to the VIN_HI output. The logic high signal is applied to the enable input of driver 106 and the M3 gate, thus disabling driver 106 and enabling the regulation loop, for start-up or short-circuit operation. The logic high signal is also applied to the control terminal of switch S1 which causes S1 to be in its closed state, and to the input of inverter 108 which converts the high signal to a low signal that is applied to the control terminal of switch S2 which causes S2 to be in its open state. Thus, VIN is provided on the VMAX output.

Although component and parameter values and sizes can vary from one example to the next, Table 1 shows a set of component and parameter values and sizes, according to one such example.

TABLE 1

Example Values and Sizes

| | |
|---|---|
| R1 | 100 Kohms |
| R2 | 500 ohms |
| R3 | 125 Kohms |
| R4 | 375 Kohms |
| C1 | 160 pF |
| COUT | 10 μF |
| L1 | 1 μH |
| M1 VGS | 0.7 volts |
| M2 VGS | 1 volt |
| VREF | 1.25 volts |
| VIN_HI | 0 volts (low state); 3.6 volts (high state) |
| M1 RDSon | 47 milliohms |
| RLOAD | 5 ohms to 5 Kohms |
| VIN | 0.5 to 5 volts |
| VOUT | 1.8 to 5.5 volts |
| LS_CON | 0 to 5 volts |
| HS_GT | 0 to 10 volts |
| LS_CON | 0 to 5 volts |
| IL | 0 to 2 amps |
| M1 | 0.08 mm$^2$ (NMOS power FET) |
| M2 | 0.001 mm$^2$ (PMOS control FET) |
| M3 | 0.001 mm$^2$ (NMOS control FET) |
| M4 | 0.08 mm$^2$ (NMOS power FET) |

So, in one such example, a load disconnect boost converter is provided that receives 5 volts on its VIN terminal and can generate up to 5.5 volts at its output terminal, and has an NMOS power FET as the high-side switching element (M1). The NMOS power FET has a back-gate that is switchable based on the voltage level of VIN and VOUT (or a back-gate that is connected to VOUT with a series resistor R1 as shown), so the diode path from the switching node to VOUT is blocked. The boost converter can be in a disabled state or enabled state. In the disabled state, the following applies: VIN is greater than VOUT; VMAX equals VIN; VIN_HI equals high; driver 106 is disabled; HS_GT equals 0 volts; M1 back-gate equals VOUT. Thus, in this disabled state, load disconnect is achieved and no current flows from VIN to output terminal.

When in the enabled state, the boost converter may be in normal operation mode or a start-up or short-circuit mode. In normal operation mode, the following applies: VIN is less than VOUT; VMAX equals VOUT; and VIN_HI equals low. Accordingly, the bootstrap driver circuit including driver 106 is enabled and fully turns on M1 during the boost converter high-side on-phase, and the regulation loop is disabled (VIN_HI is set to low). In start-up and output short-to-ground operation mode, the following applies: VIN is greater than or equal to VOUT; VMAX equals VIN; and VIN_HI equals high. Accordingly, the bootstrap driver circuit including driver 106 is disabled, and the regulation loop is enabled and regulates the switching node voltage to about 1 volt higher than VIN (VMAX+VGS_M2), with M1 being in saturation mode. So, the current through inductor L1 follows the volt-second balance rule, and the boost converter control circuit can operate similar to normal operation.

Figure 3A:
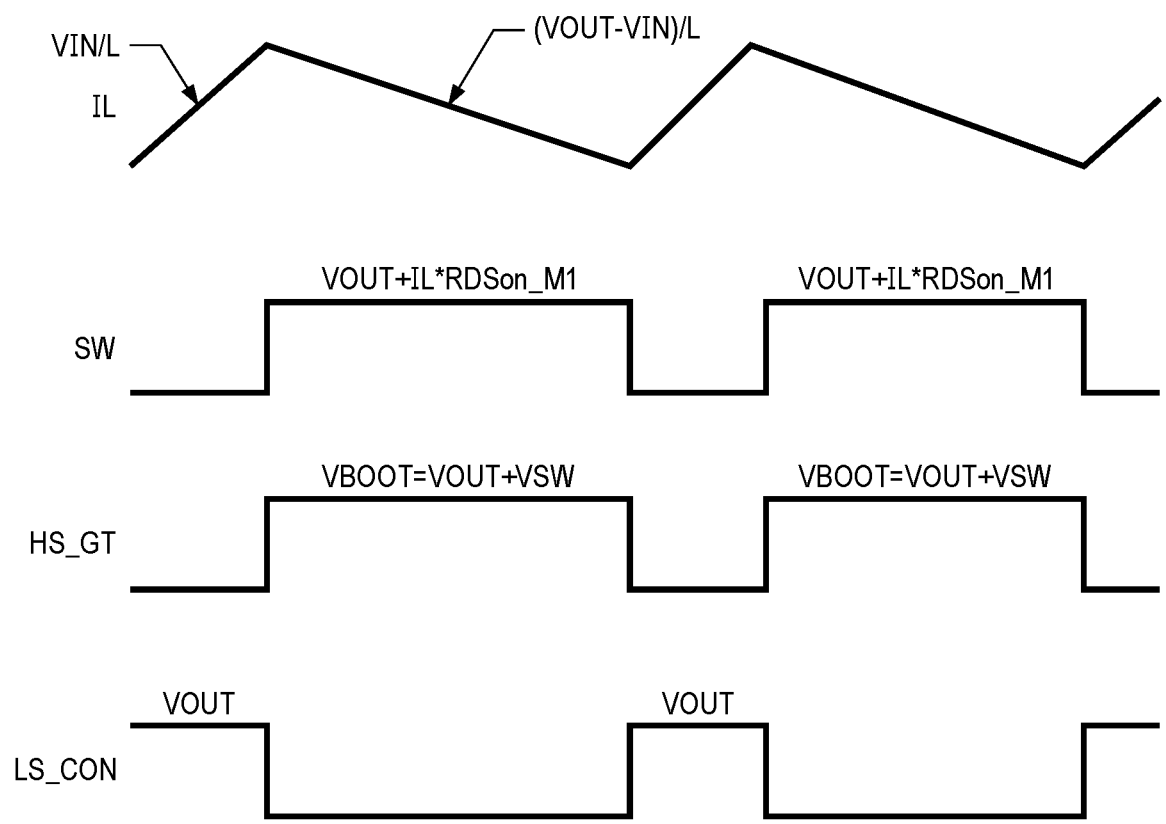
FIG. 3A illustrates a signal and timing diagram of a switching power supply in a first operating mode, in an example.

FIG. 3A illustrates a signal and timing diagram of a switching power supply in a normal operating mode, in an example. Assume in this example that: VIN equals 3.6 volts, VOUT equals 3.6 volts to 5.5 volts, VIN_HI equals 0 volts (low), and VMAX equals VOUT. As shown in FIG. 3A, during the low-side on-phase: LS_CON equals VOUT (M4 is on), HS_GT equals 0 volts (M1 is off), and the L1 inductor current (IL) ramps up with di/dt=VIN/L1. As further shown in FIG. 3A, during the high-side on-phase: LS_CON equals 0 volts (M4 is off), HS_GT equals VBOOT (M1 is on), the regulation loop is not working or otherwise enabled, and the L1 inductor current (IL) ramps down with di/dt=(VOUT−VIN)/L1. VBOOT is the voltage on the boot node and equals VOUT+VSW. VSW is the voltage on the switching node and equals VOUT+(IL*RDSon_M1). RDSon_M1 is the drain-to-source on-resistance of M1.

Figure 3B:
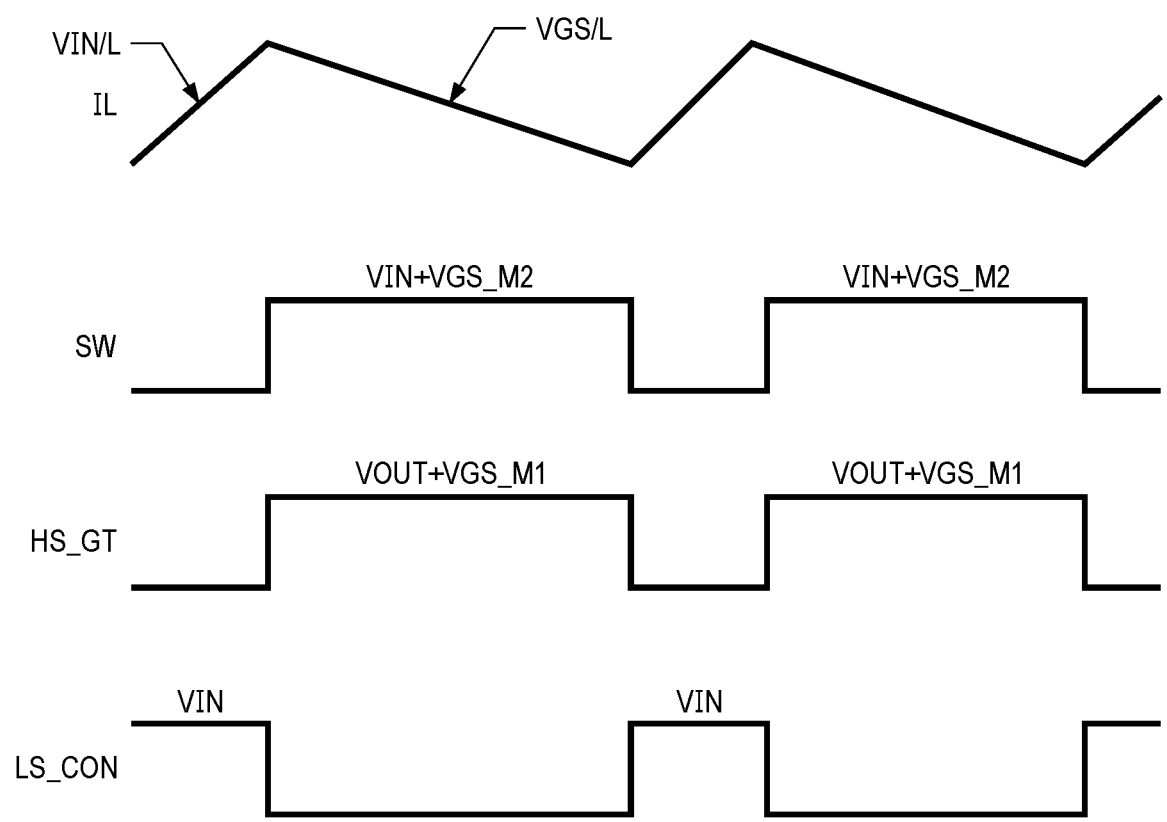
FIG. 3B illustrates a signal and timing diagram of a switching power supply in a second operating mode, in an example.

FIG. 3B illustrates a signal and timing diagram of a switching power supply in a start-up or short-circuit operating mode, in an example. During start-up, assume in this example that: VIN equals 3.6 volts, VOUT equals 0 volts to 3.6 volts, VIN_HI equals 3.6 volts (high), and VMAX equals VIN. As shown in FIG. 3B, during the low-side on-phase: LS_CON equals VIN (M4 is on), HS_GT equals 0 volts (M1 is off), and the L1 inductor current (IL) ramps up with di/dt=VIN/L1. As further shown in FIG. 3B, during the high-side on-phase: LS_CON equals 0 volts (M4 is off), HS_GT equals VOUT+VGS_M1, and the switching node voltage ramps up. VGS_M1 is the gate-to-source voltage of M1. Responsive to the switching node voltage being higher than VMAX, the regulation loop turns on and regulates the inductor current through M1. The voltage on the switching node SW is equal to VIN+VGS_M2. VGS_M2 is the gate-to-source voltage of M2. The voltage on inductor L1 is equal to SW−VIN=VGS_M2, and the L1 inductor current (IL) ramps down with di/dt=(VOUT+VGS_M1)/L1. In this manner, the boost current limit can adapt to VIN−VOUT to reduce the power dissipation during start-up of the load disconnect boost converter. Similar adaptive current limit behavior is achieved to reduce the power dissipation during an output short-to-ground.

Example Simulation

Figure 4A:
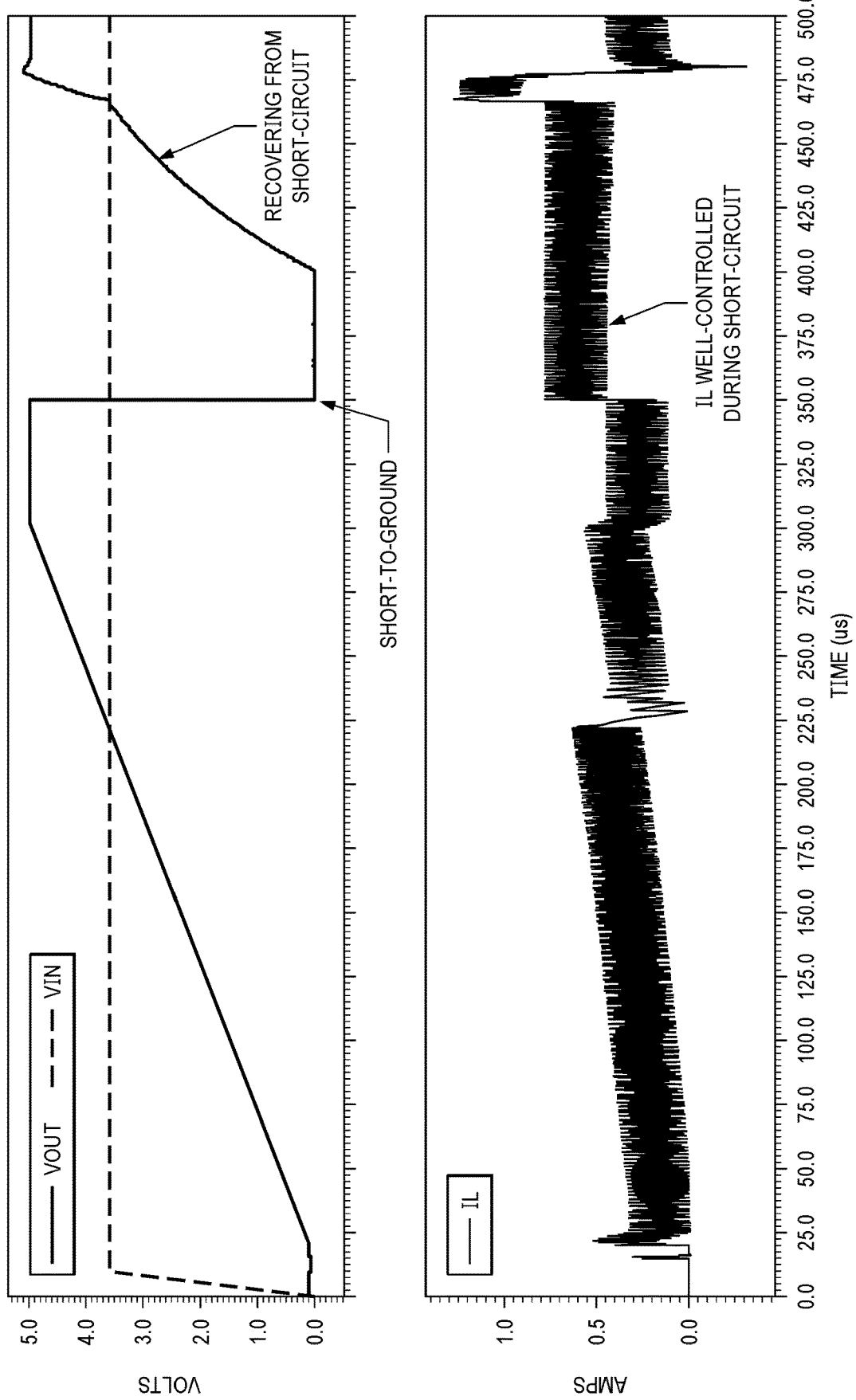
FIG. 4A-B illustrate simulation results of a switching power supply experiencing and recovering from a short-to-ground on its output voltage terminal, in an example.
Figure 4B:
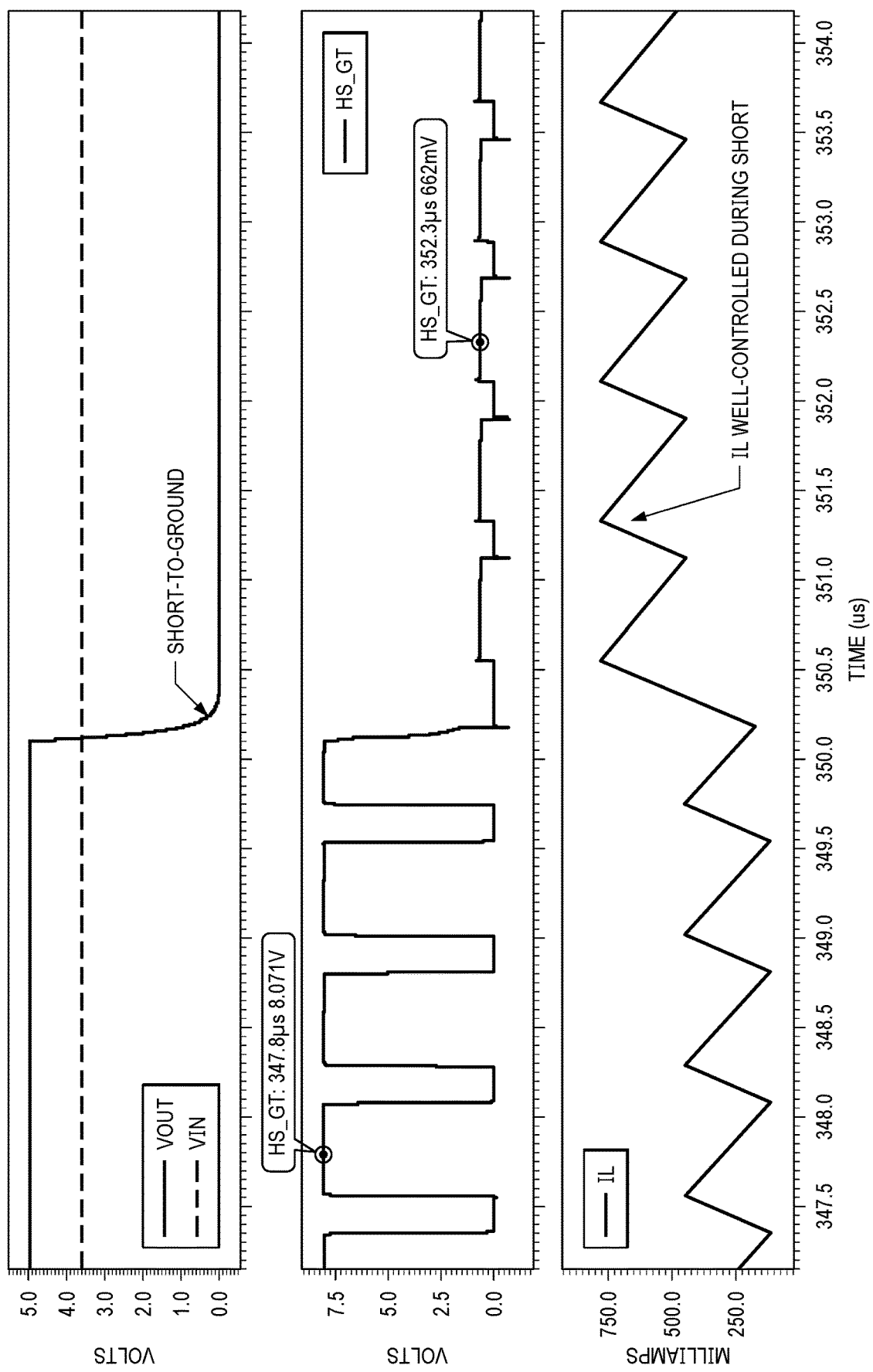

FIG. 4A-B illustrate simulation results of a switching power supply experiencing and recovering from a short-to-ground on its output voltage terminal, in an example. Assume the following set-up: VIN=3.6 volts, VOUT=5 volts, L1=1 uH; COUT=5 uF. As shown in FIG. 4A, at start-up VOUT ramps from 0 volts to 5 volts in a linear fashion, and shortly thereafter (about 350 μs from t0) a short-to-ground occurs on the VOUT terminal. At this point, the adaptive current limit functionality of the control circuit (regulation loop) engages such that the inductor current IL is nonetheless relatively well-controlled for about a 50 μs time period in which the short-circuit persists. At this point, the short-circuit condition is removed, and over the next 75 μs or so, the regulation loop operates until VOUT ramps up to VIN (or slightly greater than VIN). At this point, normal boost converter operation continues.

FIG. 4B includes an expanded time base to show further details of the simulated short-circuit and inductor current, as well as the control or gate voltage (HS_GT) applied to the high-side NMOS FET (M1). As shown, responsive to VOUT dropping below VIN, high-side gate driver is disabled and the regulation loop engages. As a result, the HS_GT voltage during high-side on-phase changes from about 8 volts (pre-short-circuit) to about 0.7 volts (while short-circuit persists). The ~0.7 volts corresponds to the gate-to-source voltage of the high-side NMOS FET, so other examples may have a different HS_GT voltage depending on the VGS value of the high-side switching element used. As further shown in the example of FIG. 4b, the inductor current prior to the short-circuit condition is held in the range of about 100 milliamps to about 450 milliamps, and is subsequently adaptively limited by operation of the control loop to the range of about 450 milliamps to about 750 milliamps during the short-circuit condition. In this manner, the current limit of the boost converter is reduced when VIN>VOUT, and the inductor current is well-controlled, even when VOUT terminal is shorted-to-ground.

Methodology

Figure 5:
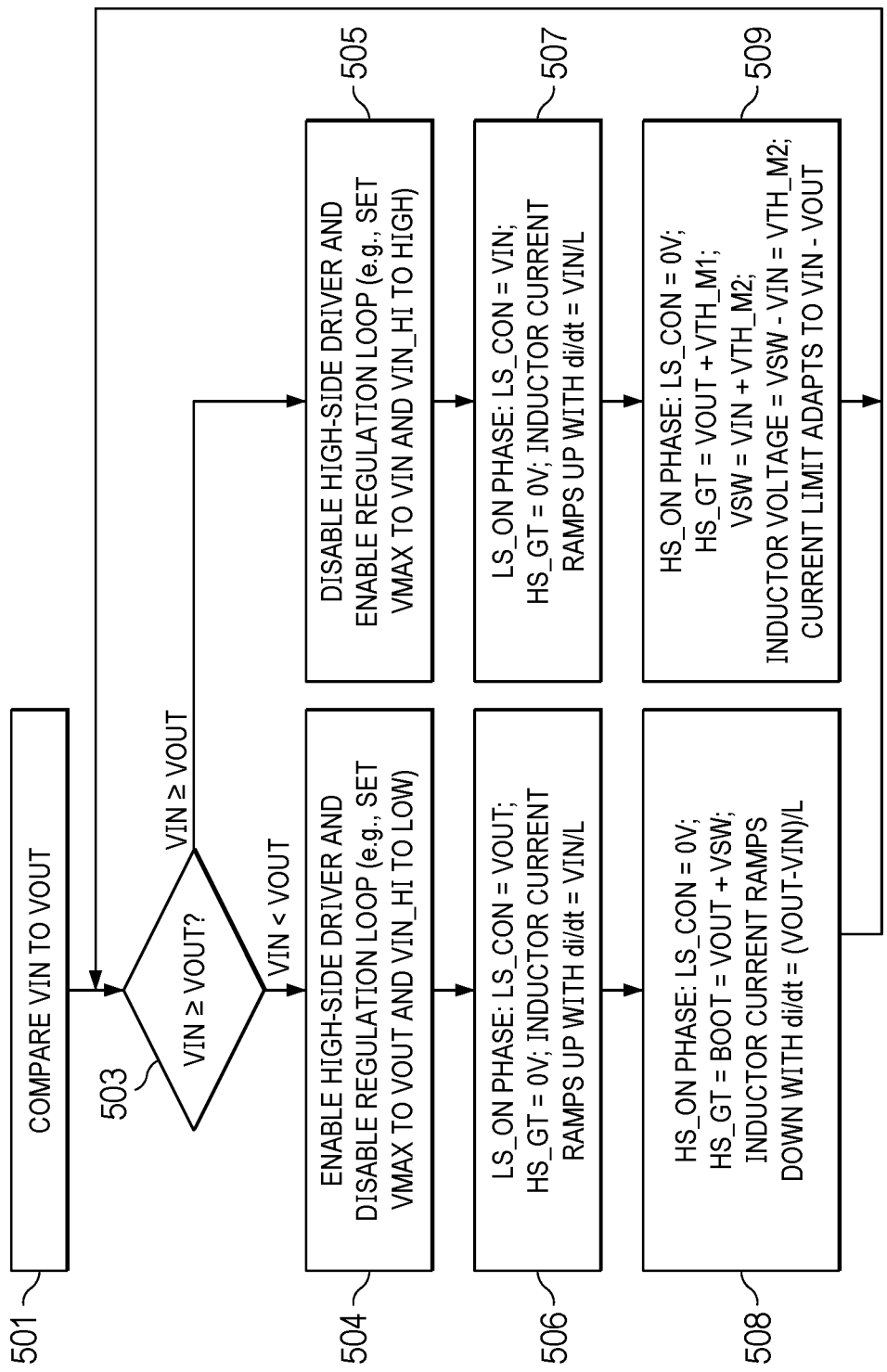
FIG. 5 illustrates a method for adaptively controlling a load disconnect boost converter, in an example.

FIG. 5 illustrates a method for adaptively controlling a load disconnect boost converter, in an example. The method may be carried out, for instance, by the example boost converter shown in FIGS. 1 and 2, although any number of other boost converter configurations that may benefit from having an NMOS high-side switching element in conjunction with load disconnect and short-circuit survival functionalities may also be configured to carry out the method.

As shown, the method includes, at 501, comparing VIN to VOUT. Based on that comparison, the method continues at 503 with determining whether VIN is greater than or equal to VOUT. Responsive to VIN being less than VOUT, normal boost converter operation commences. In normal operation mode, the method continues at 504 with enabling the driver of the high-side switching element and disabling the control circuit (regulation loop). This enabling of driver and disabling of control circuit may be accomplished, for example, by setting VIN_HI to low and VMAX to VOUT as described above with reference to comparator circuit 101.

During the low-side on-phase (LS_ON phase) operation at 506, the LS_CON signal applied to the control terminal of the low-side switching element is set to VOUT, the HS_GT signal applied to the control terminal of the high-side switching element is set to 0 volts, and the inductor current ramps up with di/dt=VIN/L. During the high-side on-phase (HS_ON phase) operation at 508, the LS_CON signal applied to the control terminal of the low-side switching element is set to 0 volts, the HS_GT signal applied to the control terminal of the high-side switching element is set to the boot voltage (BOOT=VOUT+VSW, where VSW is the switching node voltage), and the inductor current ramps down with di/dt=(VOUT−VIN)/L.

Responsive to VIN being greater than or equal to VOUT, an adaptive current limit mode commences. In this mode, the method continues at 505 with disabling the driver of the high-side switching element and enabling the control circuit (regulation loop). This disabling of driver and enabling of control circuit may be accomplished, for example, by setting VIN_HI to high and VMAX to VIN as described above with reference to comparator circuit 101.

During the low-side on-phase (LS_ON phase) operation at 507, the LS_CON signal applied to the control terminal of the low-side switching element is set to VIN, the HS_GT signal applied to the control terminal of the high-side switching element is set to 0 volts, and the inductor current ramps up with di/dt=VIN/L. During the high-side on-phase (HS_ON phase) operation at 509, the LS_CON signal applied to the control terminal of the low-side switching element is set to 0 volts, the HS_GT signal is set to the sum of VOUT and the threshold voltage of the high-side switching element (e.g., VOUT+VTH_M1), and the inductor current ramps down with di/dt=(VOUT+VTH_M1)/L1. The switching node voltage VSW is equal to VIN+VTH_M2. VTH_M1 is threshold voltage of M1, and VTH_M2 is the threshold voltage of M2. In some examples, where M1 and M2 are implemented with FETs, the threshold voltage for each is the gate-to-source voltage (VTH=VGS). The voltage on boost inductor is equal to VSW−VIN, which is equal to VTH_M2. In this manner, the boost current limit can adapt to VIN−VOUT to reduce the power dissipation during start-up or output short-circuit operations of the load disconnect boost converter.

FURTHER EXAMPLES

Example 1 is a power supply circuit, comprising: a comparator circuit having a comparator output and first and second comparator inputs, the first comparator input coupled to an input voltage terminal, the second comparator input coupled to an output voltage terminal, the comparator circuit configured to provide a voltage at the comparator output, in which the provided voltage is a larger of a voltage at the first comparator input or a voltage at the second comparator input; a first transistor coupled between the output voltage terminal and the input voltage terminal; and a second transistor coupled between a control terminal of the first transistor and the input voltage terminal, the second transistor having a control terminal coupled to the comparator output. In some such examples, the comparator circuit may be similar to comparator circuit 101, and the first and second transistors may be FETs M1 and M2, respectively.

Example 2 includes the power supply circuit of Example 1, wherein the comparator output is a first comparator output, and the comparator circuit includes a second comparator output, and wherein the comparator circuit is further configured to provide at the second comparator output a logic low signal responsive to the voltage at the first comparator input being less than the voltage at the second comparator input, and to provide at the second comparator output a logic high signal responsive to the voltage at the first comparator input being greater than or equal to the voltage at the second comparator input, the power supply circuit comprising: a third transistor coupled between the control terminal of the first transistor and a ground terminal, the third transistor having a control terminal coupled to the second comparator output. In some such examples, the first comparator output may be VMAX, the second comparator output may be VIN_HI, and the third transistor may be FET M3.

Example 3 includes the power supply circuit of Example 2, wherein the third transistor is coupled to the control terminal of the first transistor via a resistor.

Example 4 includes the power supply circuit of Example 2 or 3, and further includes a driver circuit having a driver circuit output and an enable input, the driver circuit output coupled to the control terminal of the first transistor, and the enable input coupled to the second comparator output.

Example 5 includes the power supply circuit of any one of Examples 1 through 4, and further includes: a voltage divider circuit (e.g., R3 and R4) having a voltage divider input and a voltage divider output, the voltage divider input coupled to the output voltage terminal, wherein the voltage divider circuit is configured to provide a feedback signal at the voltage divider output, the feedback signal representative of a voltage at the output voltage terminal; a reference voltage circuit (e.g., VREF 104) having a reference voltage output, the reference voltage circuit configured to provide a reference voltage at the reference voltage output; and a pulse width modulation (PWM) controller (e.g., PWM 102) having a first PWM controller input, a second PWM controller input, and a PWM controller output, the first PWM controller input coupled to the voltage divider output, the second input coupled to the reference voltage output, and the PWM controller output configured to provide a PWM control signal.

Example 6 includes the power supply circuit of Example 5, and further includes: a driver circuit (e.g., level shifter 105 and driver 106) having an input terminal and a power rail terminal, wherein the input terminal of the driver circuit is coupled to the PWM controller output; and a capacitor (e.g., C1) coupled between the input voltage terminal and the power rail terminal of the driver circuit.

Example 7 includes the power supply circuit of any one of Examples 1 through 6, wherein the first transistor is a high-side switching transistor, the power supply circuit further comprising: a low-side switching transistor coupled between the input voltage terminal and a ground terminal, and the low-side switching transistor having a control terminal coupled to a PWM controller low-side output.

Example 8 includes the power supply circuit of any one of Examples 1 through 7, wherein the first and second transistors are field effect transistors, the control terminal of the first transistor being a gate terminal of the first transistor, the control terminal of the second transistor being a gate terminal of the second transistor, and the first transistor has a body terminal coupled to a drain terminal of the first transistor via a resistor, and wherein the second transistor has a drain terminal coupled to the gate terminal of the first transistor via a diode, the diode having its anode coupled to the drain terminal of the second transistor and its cathode coupled to the gate terminal of the first transistor.

Example 9 includes the power supply circuit of any one of Examples 1 through 8, wherein the first transistor is an n-channel power field effect transistor (FET).

Example 10 is an integrated circuit package comprising: the power supply circuit of any one of Examples 1 through 9; and an inductor (e.g., L1) coupled between to the input voltage terminal and corresponding terminals of the first and second transistors.

Example 11 is a power supply circuit, comprising: a comparator circuit having first and second comparator inputs and first and second comparator outputs, the first comparator input coupled to an input voltage terminal, the second comparator input coupled to an output voltage terminal, wherein the comparator circuit configured to provide a voltage at the first comparator output, in which the provided voltage is a larger of a voltage at the first comparator input or a voltage at the second comparator input, and wherein the comparator circuit is further configured to provide at the second comparator output a logic low signal responsive to the voltage at the first comparator input being less than the voltage at the second comparator input, and to provide at the second comparator output a logic high signal responsive to the voltage at the first comparator input being greater than or equal to the voltage at the second comparator input; a high-side switching transistor (e.g., M1) having a drain terminal coupled to the output voltage terminal, and a source terminal coupled to the input voltage terminal; a first transistor (e.g., M2) having a drain terminal coupled to a gate terminal of the high-side switching transistor via a diode (e.g., D2), a source terminal coupled to the input voltage terminal, and a gate terminal coupled to the first comparator output, the diode having its anode coupled to the drain terminal of the first transistor and its cathode coupled to the gate terminal of the high-side switching transistor; a second transistor (e.g., M3) having a drain terminal coupled to the gate terminal of the high-side switching transistor via a resistor (e.g., R2), a source terminal coupled to a ground terminal, and a gate terminal coupled to the second comparator output; a high-side driver circuit having a high-side driver circuit input, a high-side driver circuit output, and a high-side driver circuit enable input, the high-side driver circuit output coupled to the cathode of the diode (e.g., D2) and the gate terminal of the high-side switching transistor (e.g., M1), and the high-side driver circuit enable input coupled to the second comparator output; a low-side transistor (e.g., M4) having a drain terminal coupled to the input voltage terminal and a source terminal coupled to the ground terminal; and a pulse width modulation (PWM) controller having a high-side output and a low-side output, the high-side output coupled to the high-side driver circuit input, and the low-side output coupled to a gate terminal of the low-side transistor.

Example 12 includes the power supply circuit of Example 11, wherein the high-side switching transistor is an n-channel power field effect transistor (FET), and has its body terminal coupled to its drain terminal via a resistor.

Example 13 includes the power supply circuit of Example 11 or 12, wherein the power supply circuit is a DC-to-DC boost converter circuit.

Example 14 is an integrated circuit package comprising the power supply circuit of any one of Examples 11 through 13.

Example 15 is a comparator circuit, comprising: a first input terminal to receive an input voltage of a power supply circuit; a second input terminal to receive an output voltage of the power supply circuit; a first output terminal to provide the larger of the input voltage or the output voltage; and a second output terminal to provide a logic low signal responsive to the input voltage being less than the output voltage, and to provide a logic high signal responsive to the input voltage being greater than or equal to the output voltage.

Example 16 includes the comparator circuit of Example 15, and further includes: an amplifier having a non-inverting input, an inverting input, and an amplifier output, the non-inverting input coupled to the first input terminal, the inverting input coupled to the second input terminal, and the amplifier output coupled to the second output terminal; a first switch for switching the input voltage to the first output terminal, and having a first switch control terminal coupled to the amplifier output; a second switch for switching the output voltage to the first output terminal, and having a second switch control terminal; and an inverter having an inverter input and an inverter output, the inverter input coupled to the amplifier output, and the inverter output coupled to the second switch control terminal.

Example 17 is a power supply circuit comprising the comparator circuit of Example 15, wherein the first input terminal is coupled to an input voltage terminal of the power supply circuit, and the second input terminal is coupled to an output voltage terminal of the power supply circuit.

Example 18 includes the power supply circuit of Example 17, and further includes: a power converter circuit including a low-side switching element, a high-side switching element, and a high-side driver circuit, the low-side switching element having a low-side control terminal, and the high-side switching element having a high-side control terminal coupled to an output terminal of the high-side driver circuit, and the second output terminal of the comparator circuit coupled to an enable input of the high-side driver circuit; and a PWM controller having a high-side output and a low-side output, the low-side output coupled to the low-side control terminal of the low-side switching element, and the high-side output coupled to an input terminal of the high-side driver circuit.

Example 19 includes the power supply circuit of Example 18, wherein the power converter circuit further comprises: a first transistor having a drain terminal coupled to the high-side control terminal of the high-side switching element via a diode, a source terminal coupled to the input voltage terminal, and a gate terminal coupled to the first output terminal of the comparator circuit, the diode having its anode coupled to the drain terminal of the first transistor and its cathode coupled to the gate terminal of the high-side control terminal of the high-side switching element; and a second transistor having a drain terminal coupled to the high-side control terminal of the high-side switching element via a resistor, a source terminal coupled to a ground terminal, and a gate terminal coupled to the second output terminal of the comparator circuit.

Example 20 includes the power supply circuit of any one of Examples 17 through 19, wherein the power supply circuit is a DC-to-DC boost converter circuit.

Example 21 is an integrated circuit package comprising the comparator circuit of Example 15 or 16, or the power supply circuit of any one of Examples 17 through 20.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end user and/or a third party.

While the use of particular transistors is described herein, other transistors (or equivalent devices) may be used instead. For example, a p-channel field effect transistor (PFET) may be used in place of an n-channel field effect transistor (NFET) with little or no changes to the circuit. Furthermore, other types of transistors may be used (such as bipolar junction transistors (BJTs)). Furthermore, the devices may be implemented in/over a silicon substrate (Si), a silicon carbide substrate (SiC), a gallium nitride substrate (GaN) or a gallium arsenide substrate (GaAs).

References herein to a field effect transistor (FET) being "ON" means that the conduction channel of the FET is present and drain current may flow through the FET. References herein to a FET being "OFF" means that the conduction channel is not present and drain current does not flow through the FET. A FET that is OFF, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A circuit, comprising:
   comparator circuitry having a comparator output and first and second comparator inputs, the first comparator input coupled to an input voltage terminal, the second comparator input coupled to an output voltage terminal, the comparator circuitry configured to provide a voltage at the comparator output, in which the provided voltage is a larger of a voltage at the first comparator input or a voltage at the second comparator input;
   a first transistor having a first current terminal, a second current terminal, and a control terminal, the first current terminal coupled to the input voltage terminal and the second current terminal coupled to the output voltage terminal;

a second transistor having a first current terminal, a second current terminal, and a control terminal, the first current terminal coupled to the first current terminal of the first transistor, the second current terminal coupled to the control terminal of the first transistor, and the control terminal of the second transistor coupled to the comparator output; and driver circuitry having a boot terminal and an output terminal, the boot terminal coupled to the comparator output and the output terminal coupled to the control terminal of the first transistor.

2. The circuit of claim 1, wherein the comparator output is a first comparator output, and the comparator circuitry includes a second comparator output, and wherein the comparator circuitry is further configured to provide at the second comparator output a logic low signal responsive to the voltage at the first comparator input being less than the voltage at the second comparator input, and to provide at the second comparator output a logic high signal responsive to the voltage at the first comparator input being greater than or equal to the voltage at the second comparator input, the circuitry further comprising:

a third transistor coupled between the control terminal of the first transistor and a ground terminal, the third transistor having a control terminal coupled to the second comparator output.

3. The circuit of claim 2, wherein the third transistor is coupled to the control terminal of the first transistor via a resistor.

4. The circuit of claim 2, further comprising:
the driver circuitry having a driver circuitry output and an enable input, the driver circuitry output coupled to the control terminal of the first transistor, and the enable input coupled to the second comparator output.

5. The circuit of claim 1, further comprising:
voltage divider circuitry having a voltage divider input and a voltage divider output, the voltage divider input coupled to the output voltage terminal, wherein the voltage divider circuitry is configured to provide a feedback signal at the voltage divider output, the feedback signal representative of a voltage at the output voltage terminal;

reference voltage circuitry having a reference voltage output, the reference voltage circuitry configured to provide a reference voltage at the reference voltage output; and a pulse width modulation (PWM) controller having a first PWM controller input, a second PWM controller input, and a PWM controller output, the first PWM controller input coupled to the voltage divider output, the second PWM controller input coupled to the reference voltage output, and the PWM controller output configured to provide a PWM control signal.

6. The circuit of claim 5, wherein the driver circuitry has an input terminal, wherein the input terminal of the driver circuitry is coupled to the PWM controller output, and the circuit of claim 5 further comprising:

a capacitor coupled between the input voltage terminal and the boot terminal of the driver circuitry.

7. The circuit of claim 1, wherein the first transistor is a high-side switching transistor, the circuit of claim 1 further comprising:

a low-side switching transistor coupled between the input voltage terminal and a ground terminal, and the low-side switching transistor having a control terminal coupled to a PWM controller low-side output.

8. The circuit of claim 1, wherein the first and second transistors are field effect transistors, the control terminal of the first transistor being a gate terminal of the first transistor, the control terminal of the second transistor being a gate terminal of the second transistor, and the first transistor has a body terminal coupled to a drain terminal of the first transistor via a resistor, and wherein the second transistor has a drain terminal coupled to the gate terminal of the first transistor via a diode, the diode having its anode coupled to the drain terminal of the second transistor and its cathode coupled to the gate terminal of the first transistor.

9. The circuit of claim 1, wherein the first transistor is an n-channel power field effect transistor (FET).

10. The circuit of claim 1, further comprising:
an inductor coupled between to the input voltage terminal and corresponding terminals of the first and second transistors.

11. A circuit, comprising:
comparator circuitry having first and second comparator inputs and first and second comparator outputs, the first comparator input coupled to an input voltage terminal, the second comparator input coupled to an output voltage terminal, wherein the comparator circuitry configured to provide a voltage at the first comparator output, in which the provided voltage is a larger of a voltage at the first comparator input or a voltage at the second comparator input, and wherein the comparator circuitry is further configured to provide at the second comparator output a logic low signal responsive to the voltage at the first comparator input being less than the voltage at the second comparator input, and to provide at the second comparator output a logic high signal responsive to the voltage at the first comparator input being greater than or equal to the voltage at the second comparator input;

a first transistor having a first current terminal, a second current terminal, and a control terminal, the first current terminal coupled to the output voltage terminal, and the second current terminal coupled to the input voltage terminal;

a second transistor having a first current terminal, a second current terminal, and a control terminal, the first current terminal coupled to the control terminal of the first transistor via a diode, the second current terminal coupled to the input voltage terminal, and the control terminal of the second transistor coupled to the first comparator output, the diode having an anode and a cathode, the anode coupled to the first current terminal of the second transistor and the cathode coupled to the control terminal of the first transistor;

a third transistor having a current terminal and a control terminal, the current terminal coupled to the control terminal of the first transistor via a resistor, and the control terminal of the third transistor coupled to the second comparator output;

driver circuitry having an input, an output, and an enable input, the output coupled to the cathode of the diode and to the control terminal of the first transistor, and the enable input coupled to the second comparator output;

a fourth transistor having a current terminal and a control terminal, the current terminal coupled to the input voltage terminal; and a controller having a first output and a second output, the first output coupled to the input of the driver circuitry, and the second output coupled to the control terminal of the fourth transistor.

12. The circuit of claim 11, wherein the first transistor is an n-channel power field effect transistor (FET), and has its body terminal coupled to the first current terminal via a resistor.

13. The circuit of claim 11, wherein the circuit of claim 11 is a direct current (DC)-to-DC boost converter circuit.

14. An integrated circuit package comprising the circuit of claim 11.

15. A comparator circuit having a first input terminal, a second input terminal, a first output terminal, and a second output terminal, the comparator circuit comprising:
- an amplifier having a first input, a second input, and an output, the first input coupled to the first input terminal of the comparator circuit, the second input terminal coupled to the second input terminal of the comparator circuit, and the output coupled to the second output terminal of the comparator circuit;
- a first switch having a first current terminal, a second current terminal, and a control terminal, the first current terminal coupled to the first input terminal of the comparator circuit, the second current terminal coupled to the first output terminal of the comparator circuit, and the control terminal coupled to the output of the amplifier; and
- a second switch having a first current terminal, a second current terminal and a control terminal, the first current terminal of the second switch coupled to the second input terminal, and the second current terminal of the second switch coupled to the first output terminal of the comparator circuit; and
- an inverter having an input and an output, the input coupled to the output of the amplifier and the output coupled to the control terminal of the second switch.

16. A power supply circuit comprising the comparator circuit of claim 15, wherein the first input terminal is coupled to an input voltage terminal of the power supply circuit, and the second input terminal is coupled to an output voltage terminal of the power supply circuit.

17. The power supply circuit of claim 16, further comprising:
- a power converter circuit including a low-side switching element, a high-side switching element, and a high-side driver circuit, the low-side switching element having a low-side control terminal, and the high-side switching element having a high-side control terminal coupled to an output terminal of the high-side driver circuit, and the second output terminal of the comparator circuit coupled to an enable input of the high-side driver circuit; and
- a pulse width modulation (PWM) controller having a high-side output and a low-side output, the low-side output coupled to the low-side control terminal of the low-side switching element, and the high-side output coupled to an input terminal of the high-side driver circuit.

18. The power supply circuit of claim 17, wherein the power converter circuit further comprises:
- a first transistor having a drain terminal coupled to the high-side control terminal of the high-side switching element via a diode, a source terminal coupled to the input voltage terminal, and a gate terminal coupled to the first output terminal of the comparator circuit, the diode having its anode coupled to the drain terminal of the first transistor and its cathode coupled to the gate terminal of the high-side control terminal of the high-side switching element; and
- a second transistor having a drain terminal coupled to the high-side control terminal of the high-side switching element via a resistor, a source terminal coupled to a ground terminal, and a gate terminal coupled to the second output terminal of the comparator circuit.

19. The power supply circuit of claim 16, wherein the power supply circuit is a DC-to-DC boost converter circuit.

20. The comparator circuit of claim 16, wherein the comparator circuit is configured to:
- receive an input voltage at the first input terminal;
- receive an output voltage at the second input terminal;
- provide a larger of the input voltage or the output voltage at the first output terminal; and
- provide a logic low signal at the second output terminal responsive to the input voltage being less than the output voltage, and provide a logic high signal at the second output terminal responsive to the input voltage being greater than or equal to the output voltage.

21. An integrated circuit package comprising the comparator circuit of claim 15.

* * * * *